United States Patent
Chen et al.

(10) Patent No.: US 6,680,237 B2
(45) Date of Patent: Jan. 20, 2004

(54) METHOD OF MANUFACTURING DEEP TRENCH CAPACITOR

(75) Inventors: Shih-Lung Chen, Taipei Hsien (TW); Hsiao-Lei Wang, Tainan (TW); Hwei-Lin Chuang, Changhua Hsien (TW); Yueh-Chuan Lee, Nantou Hsien (TW)

(73) Assignee: ProMos Technologies Inc., Hsinchu (TW)

( * ) Notice: Subject to any disclaimer, the term of this patent is extended or adjusted under 35 U.S.C. 154(b) by 148 days.

(21) Appl. No.: 09/967,709

(22) Filed: Sep. 27, 2001

(65) Prior Publication Data

US 2003/0017675 A1 Jan. 23, 2003

(51) Int. Cl.⁷ .............................................. H01L 21/20
(52) U.S. Cl. ........................ 438/386; 438/243; 438/244; 438/248; 438/249; 438/391; 438/392
(58) Field of Search ................................ 438/243, 244, 438/248, 249, 386, 391, 392

(56) References Cited

U.S. PATENT DOCUMENTS 6,258,689 B1 * 7/2001 Bronner et al. ............. 428/386
6,391,706 B2 * 5/2002 Wu et al. .................... 438/243

* cited by examiner

Primary Examiner—David Nelms
Assistant Examiner—Renee R. Berry
(74) Attorney, Agent, or Firm—J.C. Patents

(57) ABSTRACT

A method of manufacturing a deep trench capacitor. A deep trench is formed in a substrate. A conformal capacitor dielectric layer and a first conductive layer are sequentially formed, completely filling the deep trench. The first conductive layer has a seam. The first conductive layer is etched to open up the seam. A collar oxide layer is formed over the interior surface of the deep trench. A collar liner layer is formed over the collar oxide layer inside the deep trench. Using the collar liner layer as a mask, the collar oxide material above the first conductive layer and within the seam is removed. The collar liner layer is removed. Finally, a second conductive layer and a third conductive layer are sequentially formed inside the deep trench.

20 Claims, 7 Drawing Sheets

METHOD OF MANUFACTURING DEEP TRENCH CAPACITOR

BACKGROUND OF THE INVENTION

1. Field of Invention

The present invention relates to a method of manufacturing the capacitor of a dynamic random access memory (DRAM). More particularly, the present invention relates to a method of manufacturing a deep trench capacitor.

2. Description of Related Art

With advances made in semiconductors regarding deep sub-micron manufacturing technique, dimensions of devices have reduced correspondingly. With size reduction, space for accommodating a capacitor in a dynamic random access memory (DRAM) unit is also reduced. However, the storage capacity of a computer must increase due to a general increase in size of software programs. Such conflicting demands indicate the need for a change in the manufacturing method of DRAM.

DRAM capacitors can be roughly divided into two major types, a stacked capacitor or a deep trench capacitor. Yet, both types of capacitors face similar technical problems in manufacturing as dimension of constituent semiconductor devices in a silicon chip is reduced Most conventional semiconductor capacitors have a stacked type structure. At present, major methods for increasing effective surface area of a stacked capacitor includes depositing hemispherical grains (HSG) and shaping the capacitor surfaces into crown, fin, cylinder or extended structures. Although the stacked capacitor enjoys much popularity, planarization is still a big fabrication issue demanding much attention especially when size of each memory device is reduced by miniaturization.

Because a deep trench capacitor is formed inside a substrate, planarization is not a problem. In fact, the deep trench structure facilitates the fabrication of small memory devices. However, producing semiconductor devices having a line width of about 0.2 $\mu$m demands the production of a trench having an aspect ratio of up to 35:1. To advance to the production of device with a line width of 0.17 $\mu$m or less, even less space is available for housing each trench and hence the difficulties in shaping a deep trench by photolithographic and etching processes are deeply intensified. Furthermore, gap-filling materials necessary for filling the deep trench must be improved.

Nevertheless, for 0.17 $\mu$m line width generation of deep trench DRAM capacitors, one major factor that determines the failure of a single memory cell is whether the interface between a first conductive layer and a second conductive layer inside the deep trench structure is conductive or not. Hence, how to maintain conduction at the interface between the first and second conductive layer inside the trench is of major importance.

FIGS. 1A through 1D are schematic cross-sectional views showing the progression of steps for fabricating a conventional deep trench type capacitor. As shown in FIG. 1A, a patterned mask layer 102 is formed over a substrate 100. The mask layer 102 and the substrate 100 are sequentially etched to form a deep trench 104. A doped region 106 is formed at the bottom of the deep trench 104 to serve as a storage electrode of the subsequently formed deep trench capacitor.

As shown in FIG. 1B, a conformal dielectric layer 108 is formed over the exposed surface of the deep trench 104. A chemical vapor deposition is conducted to fill up the deep trench 104 and form a conductive layer 110. The conductive layer 110 can be a doped polysilicon layer, for example. Because the gap-filling capacity of polysilicon deteriorates as critical dimensions of the deep trench 104 are reduced, a seam 112 is formed in the innermost portion of the conductive layer 110.

As shown in FIG. 1C, a portion of the conductive layer 110 at the top of the deep trench 104 is removed to form a conductive layer 110a at the bottom of the deep trench 104. Meanwhile, the dielectric layer 108 at the top end of the deep trench 104 is also removed. When the layer of conductive material near the top is removed, the seam 112 is exposed A collar oxide layer 114 conformal to the exposed surface is formed over the substrate 100 so that the upper surface of the mask layer 102 and the interior surface of the deep trench 104 are covered.

As shown in FIG. 1D, an anisotropic etching is conducted to remove the collar oxide layer 114 above the mask layer 102 and the conductive layer 110a and expose the conductive layer 110a. Thereafter, a conductive layer 116 that completely fills the deep trench 104 is formed so that the conductive layer 110a and the conductive layer 116 are electrically connected. The conductive layer 116 is etched back so that the upper surface of the conductive layer 116 is lower than the upper surface 100a of the substrate 100. The exposed collar oxide layer 114 on the sidewalls near the top of the deep trench 104 is removed. Conductive material is deposited into the deep trench 104 to form a conductive layer 118. The conductive layer 118 and the conductive layer 116 are electrically connected and are also electrically connected to the substrate 100. The conductive layer 110a, the conductive layer 116 and the conductive layer 118 together form the upper electrode of the deep trench capacitor However, in the aforementioned deep trench capacitor manufacturing process, the presence of the seam 112 in the conductive layer 110 leads to the opening of the seam 112 after the etching back process. Consequently, the collar oxide layer 114 at the bottom of the trench after deposition is thicker than the collar oxide layer 114 above the mask layer 102. Furthermore, a portion of the oxide filling material may leak into the seam 112. Hence, when the collar oxide layer 114 is etched, the collar oxide layer 114 over the mask layer 102 may be completely removed before the collar oxide material 114a above the conductive layer 110a and within the seam 112. The residual collar oxide material 114a between the conductive layer 110a and the conductive layer 116 forms an electrical barrier that may lead to memory cell failure and low product yield.

To remove all residual collar oxide material 114a above the conductive layer 110a and within the seam 112, a prolonged etching is required. However, by extending the etching period, thickness of the collar oxide layer lining the sidewalls of the deep trench may be reduced and other device structures may be damaged due to over-etching.

SUMMARY OF THE INVENTION

Accordingly, one object of the present invention is to provide a method of manufacturing a deep trench capacitor capable of removing residual collar oxide material from a seam and preventing electrical connectivity problem between a first conductive layer and a second conductive layer within the deep trench. Ultimately, failure of single cells is reduced and product yield of semiconductor devices is improved.

To achieve these and other advantages and in accordance with the purpose of the invention, as embodied and broadly described herein, the invention provides a method of manufacturing a deep trench capacitor. A substrate having a patterned mask layer thereon and a deep trench therein is provided. A doped region is formed in the substrate around the bottom of the deep trench. A conformal capacitor dielectric layer and a first conductive layer are sequentially formed completely filling the deep trench. Due to miniaturization, the deep trench has a high aspect ratio. Hence, a seam is formed in the first conductive layer within the deep trench after conductive material is deposited into the trench. Thereafter, a portion of the first conductive layer is removed to open up the seam. A conformal collar oxide layer and a collar liner are formed over the substrate. Material forming the collar liner layer and material forming the collar oxide layer both have a high etching selectivity ratio. A portion of the collar liner layer is removed so that the collar liner layer on the sidewalls of the deep trench is retained. The collar oxide layer above the mask layer and the first conductive layer is removed. Using the collar liner layer on the sidewalls of the deep trench as a mask, the residual collar oxide layer above the first conductive layer and within the seam is removed. The collar liner layer on the sidewalls of the deep trench is subsequently removed. Finally, a second conductive layer and a second conductive layer are sequentially formed filling the deep trench.

In this invention, a collar liner layer is formed over the collar oxide layer on the interior sidewalls of the deep trench. Hence, the collar liner layer having a lower etching rate than the oxide material can serve as a protective layer for removing any residual oxide layer at the upper surface of the first conductive layer. With the protective collar liner layer, the collar oxide layer can have a constant thickness after an etching operation.

Furthermore, since the collar liner layer can protect the collar oxide layer on the sidewalls of the deep trench, over-etching is less damaging. Hence, extended etching for completely removing any residual collar oxide material above the first conductive layer and within the seam is possible. Without any residual collar oxide material serving as an electrical barrier, memory cell failure is reduced and product yield is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
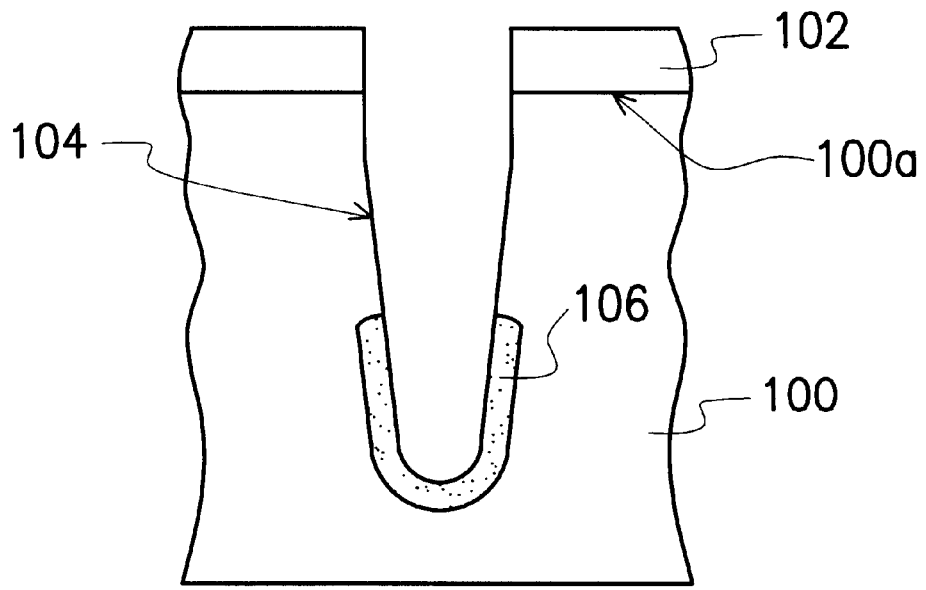
FIGS. 1A through 1D are schematic cross-sectional views showing the progression of steps for fabricating a conventional deep trench type capacitor.
Figure 1B:
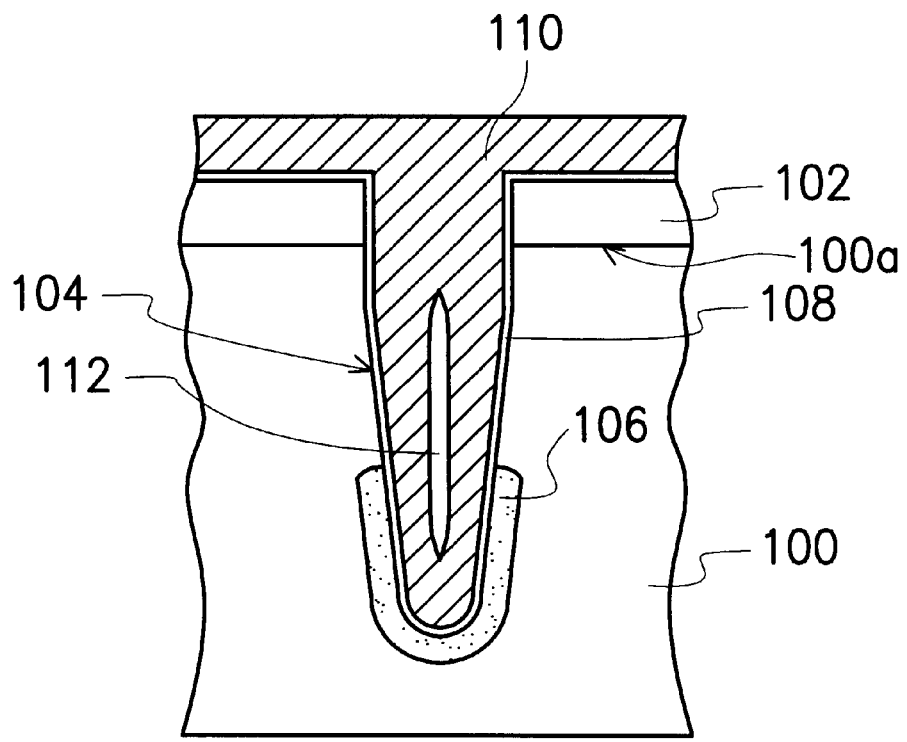
Figure 1C:
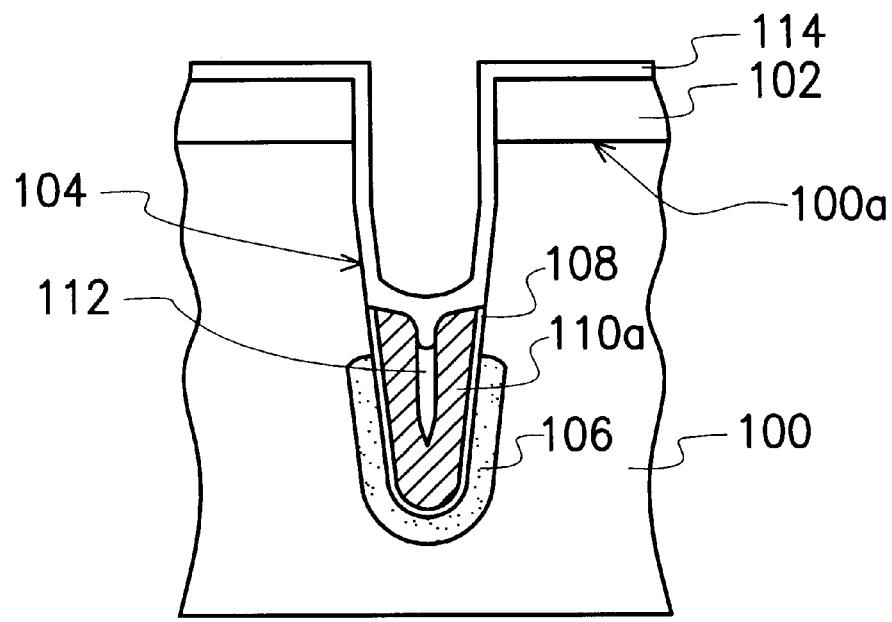
Figure 1D:
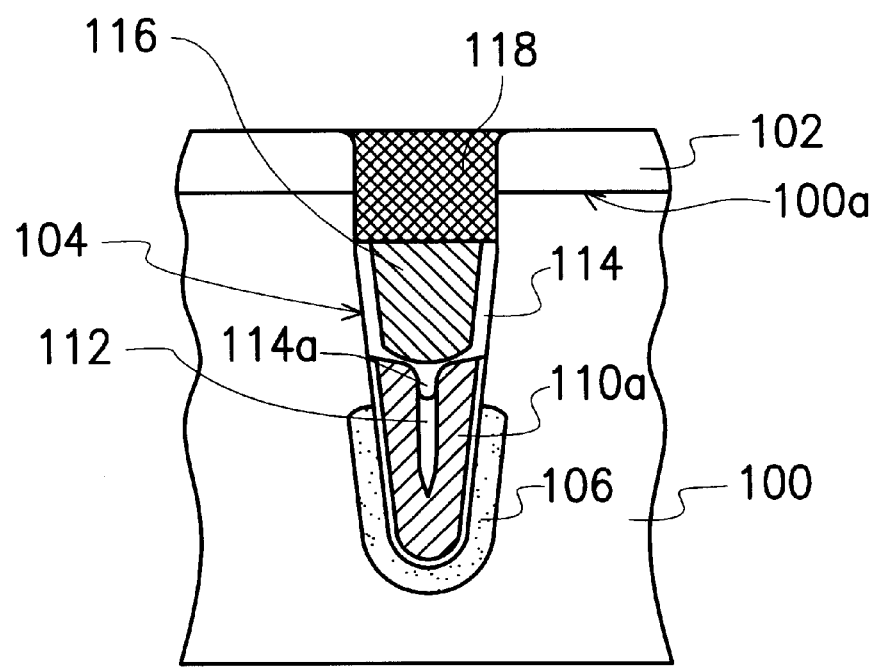

Reference will now be made in detail to the present preferred embodiments of the invention, examples of which are illustrated in the accompanying drawings. Wherever possible, the same reference numbers are used in the drawings and the description to refer to the same or like parts.

Figure 2A:
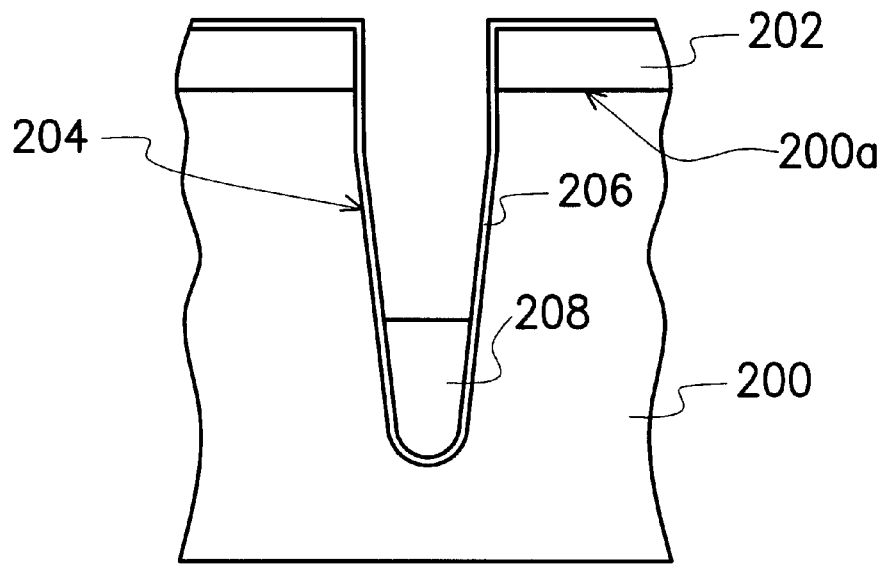
FIGS. 2A through 2J are schematic cross-sectional views showing the progression of steps for fabricating a deep trench capacitor according to one preferred embodiment of this invention.

FIGS. 2A through 2J are schematic cross-sectional views showing the progression of steps for fabricating a deep trench capacitor according to one preferred embodiment of this invention. As shown in FIG. 2A, a patterned mask layer 202 is formed over a substrate 200. The mask layer can be a silicon nitride layer formed, for example, by chemical vapor deposition (CVD) followed by a photolithographic and etching operation. An etching operation such as a dry etching is conducted to form a deep trench 204 inside the substrate 200.

A doped insulation layer 206 is formed over the interior sidewalls of the deep trench 204. The doped insulation layer 206 can be an arsenic doped silicon oxide layer formed, for example, by in-situ doping of ions in a chemical vapor deposition (CVD). A photoresist layer 208 is formed at the bottom of the deep trench 204 such that the deep trench 204 is only partially filled and the upper surface of the photoresist layer 208 is below the upper surface 200a of the substrate 200.

Figure 2B:
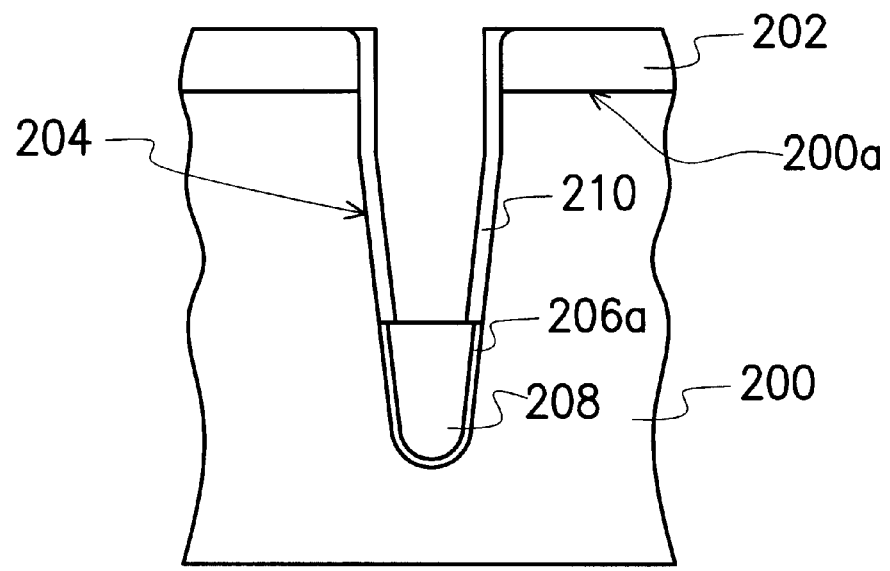

As shown in FIG. 2B, the doped insulation layer 206 not covered by the photoresist layer 208 is removed. The doped insulation layer 206 is removed, for example, by wet etching using a buffer hydrofluoric acid (BHF) or a diluted hydrofluoric acid (DHF) etching agent. Thereafter, a conformal insulation layer (not shown) is formed over the substrate 200 covering the mask layer 202 and the deep trench 204. An anisotropic etching is conducted to remove a portion of the insulation layer, thereby forming spacers 210 on the sidewalls of the deep trench 204 and exposing the upper surface of the photoresist layer 208. The spacers 210 can be a silicon oxide layer formed, for example, by chemical vapor deposition using tetra-ethyl-ortho-silicate (TEOS)/Ozone ($O_3$) as reaction gases.

Figure 2C:
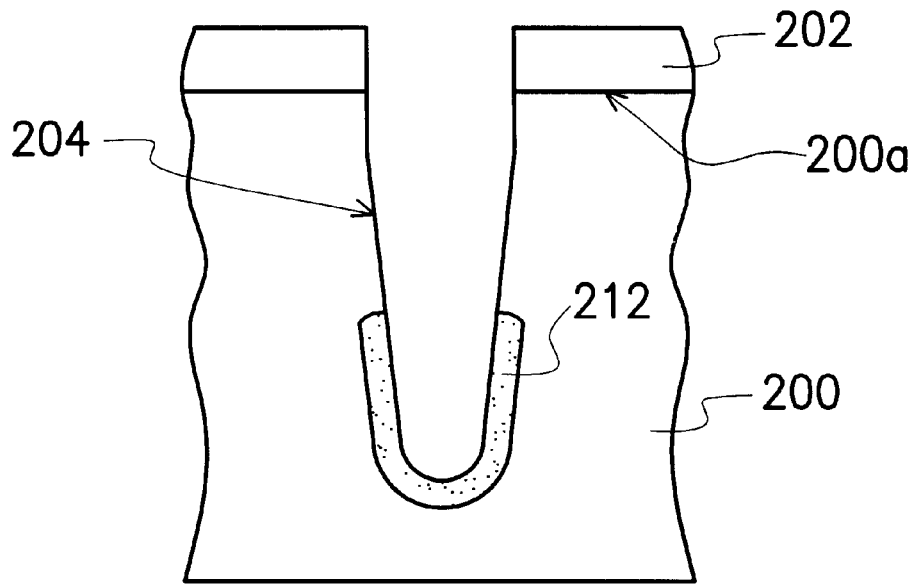

As shown in FIG. 2C, the photoresist layer 208 is removed. A thermal treatment of the substrate is carried out so that the dopants inside the doped insulation layer 206a diffuse into the substrate 200 at the bottom of the deep trench 204 to form a doped region 212. The doped region 212 serves a storage electrode of the subsequently formed deep trench capacitor. In addition, since sidewalls in the upper section of the deep trench 204 are covered by spacers 210, dopants in the doped insulation layer 206a are prevented from migrating too far and hence limiting the doped region 212 around the bottom portion of the deep trench 204. The doped insulation layer 206a at the bottom of the deep trench 204 and the spacers 210 on the sidewalls in the upper portion of the deep trench 204 are removed, for example, by wet etching using an etching agent such as buffered hydrofluoric (BHF) acid or diluted hydrofluoric (DHF) acid.

Figure 2D:
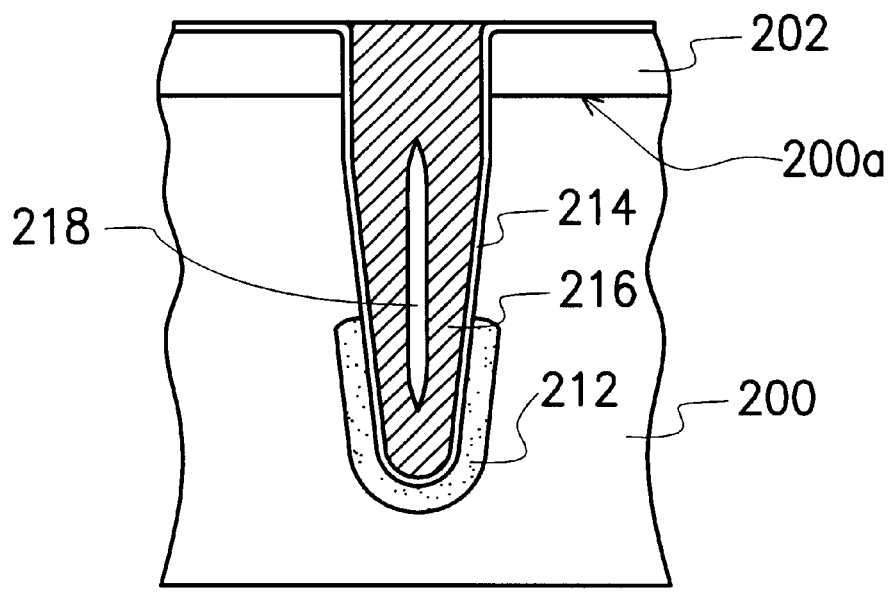

As shown in FIG. 2D, a conformal capacitor dielectric layer 214 is formed over the substrate 200 covering the exposed surface of the deep trench 204. The capacitor dielectric layer 214 can be an oxide/nitride composite layer formed, for example, by thermal oxidation or low-pressure chemical vapor deposition. A conductive layer 216 is formed, completely filling the deep trench 204. The conductive layer 216 can be a doped polysilicon layer formed, for example, by in-situ ion doping of ion in a chemical vapor deposition to form a doped polysilicon layer (not shown) over the substrate 200. Thereafter, excess doped polysilicon material above the deep trench 204 is removed by chemical-mechanical polishing (CMP). Because the deep trench 204 has a rather narrow opening, gap-filling capacity of doped polysilicon material is poor. Ultimately, a seam 218 is formed near the center of the polysilicon conductive layer 216.

Figure 2E:
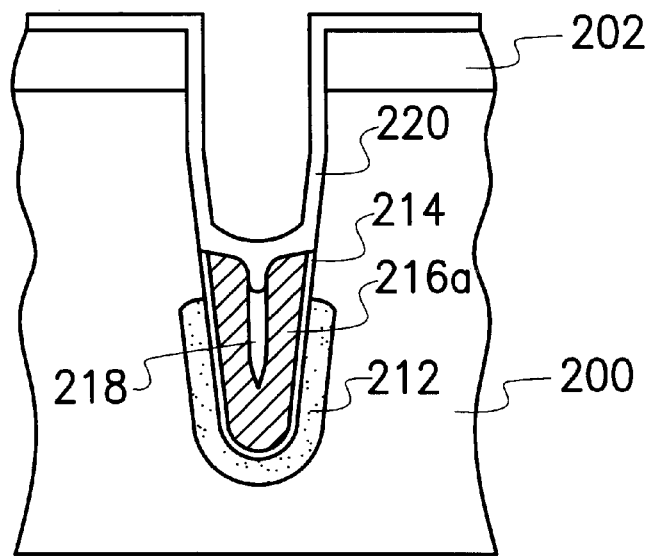

As shown in FIG. 2E, the conductive layer 216 in the upper section of the deep trench 204 is removed so that a conductive layer 216a remains at the bottom section of the deep trench 204. Meanwhile, the capacitor dielectric layer 214 in the upper section of the deep trench 204 not covered by the conductive layer 216a is also removed. Since the upper surface of the conductive layer 216a is below the upper surface 200a of the substrate 200, the seam 218 opens up after a portion of the conductive layer 216 is removed. The conductive layer 216 is removed, for example, by dry etching or wet etching. A conformal collar oxide layer 220 is formed over the substrate 200. The collar oxide layer 220 covers the upper surface of the mask layer 202 and the exposed surface of the deep trench 204. The collar oxide layer 220 is formed, for example, by chemical vapor deposition.

Figure 2F:
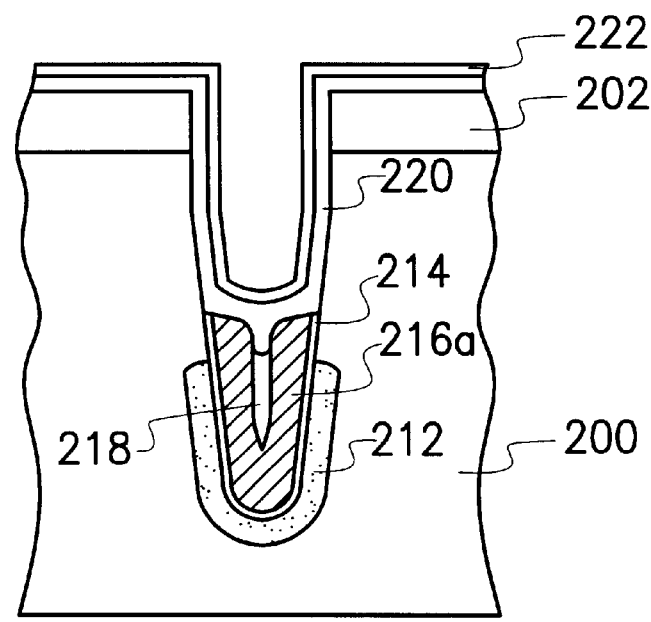

As shown in FIG. 2F, a conformal collar liner layer 222 is formed over the substrate 200 covering the collar oxide layer 220. The collar liner layer 222 can be any material having an etching selectivity different from the collar oxide layer 220, for example, silicon nitride, polysilicon, silicon or silicon oxynitride. The collar liner layer 22 is formed, for example, by conducting a plasma-enhanced chemical vapor deposition or a low-pressure chemical vapor deposition.

Figure 2G:
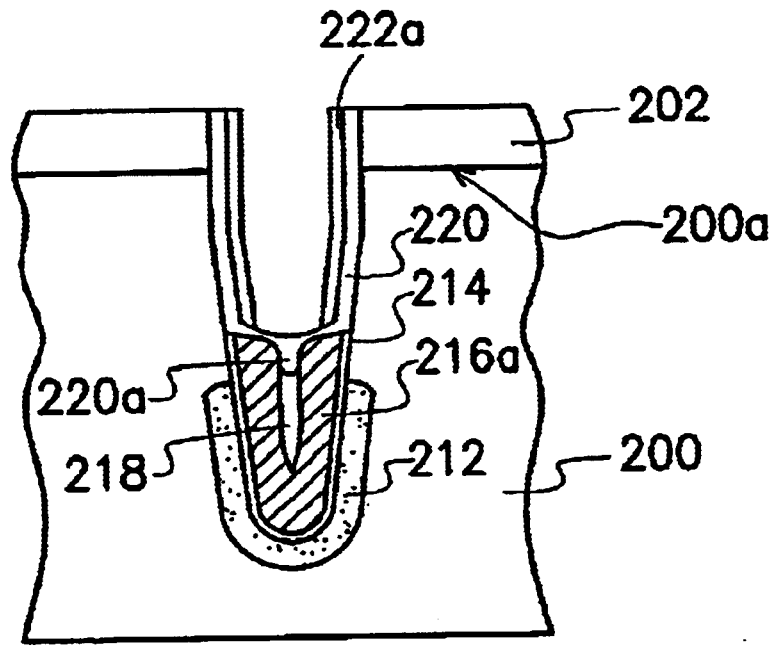

As shown in FIG. 2G, the conformal collar liner layer 222 is etched back by conducting an anisotropic etching operation. A portion of the collar liner layer 222 is removed so that only a collar liner layer 222a remains attached to the sidewalls of the deep trench 204. The collar liner layer 222 is etched using the collar oxide layer 220 as an etching stop. Hence, material constituting the collar liner layer 222 must have an etching rate considerably lower than the material constituting the collar oxide layer 220. The collar oxide layer 220 on the upper surface of the mask layer 202 and the upper section of the conductive layer 216a are removed. The collar oxide layer 220 is removed by performing an anisotropic etching operation, for example.

The seam 218 opens up after the conductive layer 216 is etched. Moreover, during conductive material deposition, the collar oxide layer 220 on the conductive layer 216a has a thickness greater than the collar oxide layer 220 on the mask layer 202 and a portion of the oxide material may leak into the opened seam 218. Hence, the collar oxide layer 220 on top of the mask layer is completely removed while residual collar oxide material 220a remains above the conductive layer 216a and within the seam 218 after the collar oxide layer 220 is etched back. This layer of residual collar oxide material 220a forms a barrier layer that prevents the conductive layer from making good electrical contact with a subsequently formed conductive layer 224.

Figure 2H:
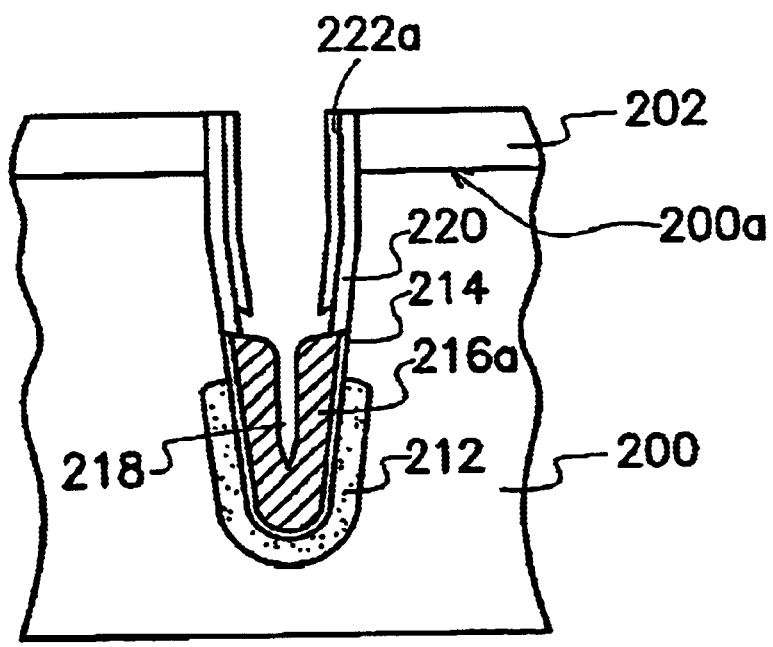

As shown in FIG. 2H, the residual collar oxide material 220a on the conductive layer 216a and within the seam 218 is removed. The residual collar oxide material 220a is removed by dry etching or wet etching using diluted hydrofluoric (DHF) acid as an etching agent. Since the etching rate of the collar liner layer 222 differs from the collar oxide layer 220, the collar oxide material 220a above the conductive layer 216a and within the seam 218 is easily removed by etching. Thickness of the collar oxide layer 220 in the upper section of the deep trench 204 remains constant after the etching due to the presence of the protective collar liner layer 222a.

Figure 2I:
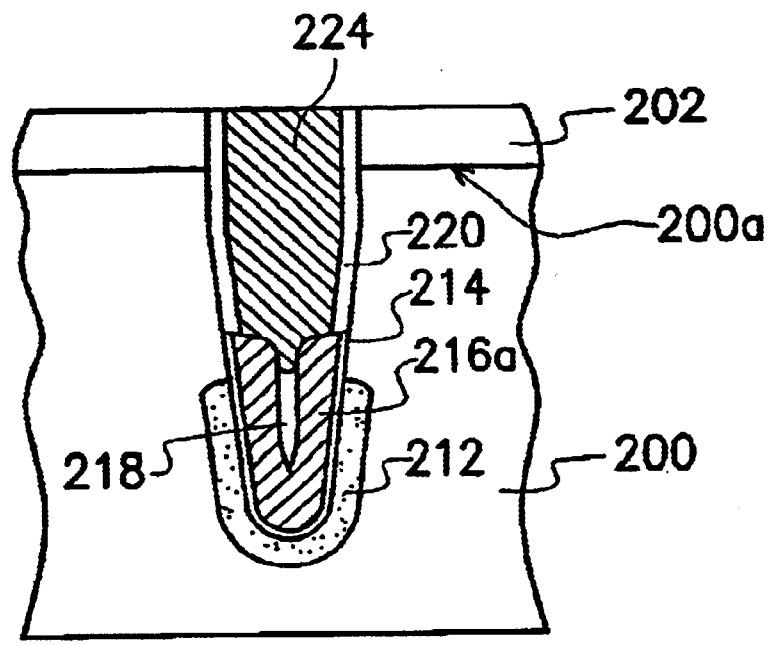

As shown in FIG. 2I, the collar liner layer 222a on the sidewalls of the deep trench 204 is removed to expose the collar oxide layer 220. If the collar liner layer 222 is a polysilicon layer, the step of removing the collar liner layer 222a to expose the collar oxide layer 220 can be skipped. A conductive layer 224 that completely fills the deep trench 204 is formed. Because no residual oxide material remains on top of the conductive layer 216a, the conductive layer 224 is able to form a good electrical contact with the underlying conductive layer 216a. The conductive layer 224 can be a doped polysilicon layer formed, for example, by performing an in-situ ion doping in a chemical vapor deposition to form a doped silicon layer (not shown) and conducting a chemical-mechanical polishing (CMP) to remove any excess doped polysilicon material above the deep trench.

Figure 2J:
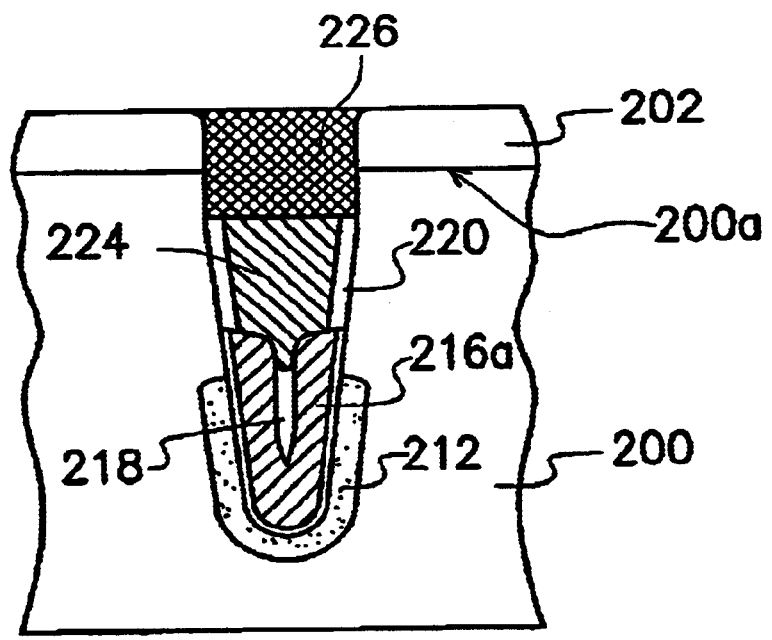

As shown in FIG. 2J, the conductive layer 224 is etched so that the upper surface of the conductive layer 224 is below the upper surface 200a of the substrate 200. The exposed collar oxide layer 220 lining the upper section of the deep trench 204 is next removed. Another conductive layer 226 is formed, completely filling the deep trench 204. The conductive layer 226 can be a doped polysilicon layer formed, for example, by performing an in-situ ion doping in a chemical vapor deposition and the conducting a chemical-mechanical polishing (CMP) to remove excess doped polysilicon layer above the deep trench 204. Hence, the conductive layer 226, the conductive layer 224 and the substrate 200 are all electrically connected. The conductive layer 216a, the conductive layer 224 and the conductive layer 226 together form the upper electrode of the deep trench capacitor.

In this invention, a collar liner layer is formed over the collar oxide layer on the interior sidewalls of the deep trench. Since the collar liner layer has a lower etching rate than the oxide material, the collar liner layer can serve as a protective layer in the process of removing any residual oxide layer on the upper surface of the first conductive layer. Hence, with the protective collar liner layer, the collar oxide layer can have a constant thickness after etching.

Furthermore, since the collar liner layer can protect the collar oxide layer on the sidewalls of the deep trench, over-etching does not have a serious effect on the device. Therefore, extended etching to remove completely any residual collar oxide material above the first conductive layer and within the seam is possible. Without any residual collar oxide material serving as an electrical barrier, memory cell failure is reduced and product yield is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a deep trench capacitor, comprising:

providing a substrate;

forming a patterned mask layer over the substrate;

forming a deep trench in the substrate using the patterned mask layer as a mask;

forming a doped region in the substrate surrounding a bottom section of the deep trench;

forming a capacitor dielectric layer over an interior surface of the deep trench;

forming a first conductive layer that completely fills the deep trench, wherein the first conductive layer contains a seam;

removing a portion of the first conductive layer to open up the seam;

forming a conformal collar oxide layer over the substrate;

forming a collar liner layer over the collar oxide layer, wherein the collar liner layer is formed using a material having an etching rate less than that of the collar oxide layer;

removing a portion of the collar liner layer so that only the collar liner layer on sidewalls in an upper portion of the deep trench is retained;

removing the collar oxide layer on an upper surface of the mask layer and the first conductive layer;

removing any residual collar oxide material above the first conductive layer and within the opened seam while using the collar liner layer on sidewalls of the deep trench as a mask;

removing the collar liner layer on the trench sidewalls; and sequentially forming a second conductive layer and a third conductive layer that completely fill the deep trench.

2. The method of claim 1, wherein material forming the collar liner layer is selected from a group consisting of silicon nitride, polysilicon, silicon and silicon oxynitride.

3. The method of claim 1, wherein removing a portion of the collar liner layer includes anisotropic etching.

4. The method of claim 1, wherein removing the collar oxide layer on the surface of the mask layer and the first conductive layer includes anisotropic etching.

5. The method of claim 1, wherein removing residual collar oxide material over the first conductive layer and within the seam includes wet etching.

6. The method of claim 1, wherein removing residual collar oxide material over the first conductive layer and within the seam includes dry etching.

7. The method of claim 1, wherein material forming the first conductive layer, the second conductive layer and the third conductive layer includes doped polysilicon.

8. The method of claim 1, wherein forming a doped region in the substrate around the bottom section of the deep trench further includes:

forming a conformal doped insulation layer over the interior surface of the deep trench;

forming a photoresist layer at the bottom section of the deep trench, wherein the photoresist layer only partially fills deep trench so that a portion of the doped insulation layer is exposed;

removing the doped insulation layer not covered by the photoresist so that the doped insulation layer surrounding the bottom section of the deep trench is retained;

forming spacers on the sidewalls of the deep trench;

removing the photoresist layer;

conducting a thermal operation such that dopants inside the doped insulation layer diffuse into the substrate to form a doped region; and removing the doped insulation layer lining the bottom section of the deep trench and the spacers lining the upper portion of the deep trench.

9. The method of claim 8, wherein material forming the doped insulation layer includes arsenic doped silicon oxide.

10. A method of manufacturing a deep trench capacitor, comprising:

providing a substrate having a patterned mask layer thereon and a deep trench therein, wherein a bottom section of the deep trench includes a doped region and an interior surface of the deep trench includes a capacitor dielectric layer;

forming a first doped polysilicon layer that completely fills the deep trench, wherein the first doped polysilicon layer has seam therein;

removing a portion of the first doped polysilicon layer to open up the seam;

forming a conformal collar oxide layer over the substrate;

forming a collar liner layer over the collar oxide layer on sidewalls of the deep trench;

removing the collar oxide layer on a surface of the mask layer and an upper section of the first doped polysilicon layer;

removing any residual collar oxide material over the first polysilicon layer and within the seam; and sequentially forming a second doped polysilicon layer and a third doped polysilicon layer that completely fill the deep trench.

11. The method of claim 10, wherein the collar liner layer is formed from a material having an etching rate that differs from that of the collar oxide layer.

12. The method of claim 11, wherein material forming the collar liner layer includes silicon nitride.

13. The method of claim 11, wherein material forming the collar liner layer includes polysilicon.

14. The method of claim 10, wherein forming a collar liner layer over the collar oxide layer further includes:

forming a polysilicon layer over the collar oxide layer; and removing a portion of the polysilicon layer by anisotropic etching.

15. The method of claim 11, wherein material forming the collar liner layer is selected from a group consisting of silicon nitride, silicon and silicon oxynitride.

16. The method of claim 15, wherein after removing residual collar oxide material from a surface of the first doped polysilicon layer and within the seam but before sequentially forming the second doped polysilicon layer and the third doped polysilicon layer, further includes removing the collar liner layer.

17. The method of claim 10, wherein removing the collar oxide material on the surface of the mask layer and the upper section of the first doped polysilicon layer includes anisotropic etching.

18. The method of claim 10, wherein removing residual collar oxide material over the first doped polysilicon layer and within the seam includes wet etching.

19. The method of claim 18, wherein removing residual collar oxide material over the first doped polysilicon layer and within the seam includes wet etching using diluted hydrofluoric acid as an etching agent.

20. The method of claim 10, wherein removing residual collar oxide material over the first doped polysilicon layer and within the seam includes dry etching.

* * * * *